(12) United States Patent
Chan et al.

(10) Patent No.: US 6,262,464 B1
(45) Date of Patent: Jul. 17, 2001

(54) ENCAPSULATED MEMS BRAND-PASS FILTER FOR INTEGRATED CIRCUITS

(75) Inventors: Kevin K. Chan, Staten Island, NY (US); Christopher Jhanes, Upper Saddle River, NJ (US); Leathen Shi, Yorktown Heights, NY (US); James L. Speidell, Poqughquag, NY (US); James F. Ziegler, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/596,725

(22) Filed: Jun. 19, 2000

(51) Int. Cl.[7] .............................. H01L 27/14; H01L 29/82
(52) U.S. Cl. ........................ 257/414; 257/415; 257/416
(58) Field of Search ................................. 257/414, 415, 257/416

(56) References Cited

U.S. PATENT DOCUMENTS

| 4,516,271 | 5/1985 | Fraise | 455/327 |
|---|---|---|---|
| 5,083,139 | 1/1992 | Sakamoto | 346/76 PH |
| 5,528,769 | 6/1996 | Berenz et al. | 455/333 |
| 5,563,545 | 10/1996 | Scheinberg | 327/389 |
| 5,649,312 | 7/1997 | Kennan | 455/333 |
| 5,918,168 | 6/1999 | Abe et al. | 455/315 |

OTHER PUBLICATIONS

Clark T.–C. Nguyen "High–Q Micromechanical Oscillators and Filters for Communication", IEEE International Symposium on Circuits and Systems, Jun. 9–12, 1997, Hong Kong, pp. 2852–2828.

James M. Bustillo, et al. "Surface Micromachining for Microelectromechanical Systems", Proceedings of the IEEE, vol. 86, No. 8, Aug. 1998, pp. 1552–1574.

Clark T.–C. Nguyen, et al. "Micromachined Devices for Wireless Communications", Proceedings of the IEEE, vol. 86, No. 8, Aug. 1998, pp. 1756–1768.

Ark–Chew Wong, et al "Micromechanical Mixer+ Filters", Teah. Dig. of IEEE'IEDM, Dec. 1998, pp. 471–474.

*Primary Examiner*—Minh Loan Tran
(74) *Attorney, Agent, or Firm*—Scully, Scott, Murphy & Presser; Daniel P. Morris, Esq.

(57) ABSTRACT

Communication signal mixing and filtering systems and methods utilizing an encapsulated micro electro-mechanical system (MEMS) device. Furthermore, disclosed is a method of fabricating a simple, unitarily constructed micro electro-mechanical system (MEMS) device which combines the steps of signal mixing and filtering, and which is smaller, less expensive and more reliable in construction and operation than existing devices currently employed in the technology.

27 Claims, 4 Drawing Sheets

ENCAPSULATED MEMS BRAND-PASS FILTER FOR INTEGRATED CIRCUITS

BACKGROUND OF THE INVENTION

1. Field of the Invention

The present invention relates to communication signal mixing and filtering systems and methods utilizing an encapsulated micro electro-mechanical system (MEMS) device. Furthermore, the invention is also directed to a method of fabricating a simple, unitarily constructed micro electro-mechanical system (MEMS) device which combines the steps of signal mixing and filtering, and which is smaller, less expensive and more reliable in construction and operation than existing devices currently employed in the technology.

Micro electro-mechanical system (MEMS) technology has been proposed for the fabrication of narrow band-pass filters (high-Q filters) for various communication circuits at frequencies below 200 MHz. Ordinarily, these filters employ the natural vibrational frequency of micro-resonators in order to be able to transmit signals at very precise frequencies, while concurrently attenuating signals and noise encountered at other frequencies.

In essence, communication carrier signals at radio frequencies (RF) are normally converted to intermediate frequencies (IF) for processing such as channel selection, signal isolation and the like. This particular conversion is generally implemented by mixing a carrier signal with the sinusoidal output of an oscillator in a non-linear device so that an output signal is generated which is either the sum of or the difference between the two input signals. A band-pass filter is then employed in order to select the desired converted intermediate frequency (IF) carrier signal for processing. Thereafter, a second conversion may be implemented in order to remove the intermediate frequency carrier and extract the final communication information; for instance, such as an audio message. The same two conversion steps may also be implemented in transmission in a reverse order; in effect, proceeding from an audio signal to the intermediate frequency (IF) carrier and then to the final communication radio frequency (RF) carrier frequency.

Basically, super-heterodyne communication transceivers depend upon precision electrical filtering and carrier signal mixing for signal processing at convenient intermediate frequencies. Generally these circuits possess three stages of operation. In a first stage, the radio frequency (RF) input signals are isolated utilizing a band-pass filter and then amplified. In a second stage, this signal is then beat against an intermediate frequency oscillator signal in order to reduce (or alternatively increase) its frequency for signal processing. In a third stage, after processing, the signal may then be further modulated with another oscillator signal in order to obtain audible frequencies for communication. These same stages may also occur in a reverse sequence in translating from audio frequencies to (RF) carrier transmission.

The present invention uniquely utilizes the above-mentioned first and second stages of operation, in which the carrier frequency is changed in order to perform various functions on the signal.

The conversion and filtering steps referred to hereinabove, can be implemented through the intermediary of pure electronic circuits; however, the resultant intermediate carrier is normally considered too broad in its frequency range for precision processing. Currently, the radio frequency (RF) filter is made with the excitation of an external crystal, commonly in a transmission mode. The intermediate frequency (IF) is filtration commonly attained with the use of external surface acoustic-wave (SAW) filters. The use of these two components which are ordinarily provided externally of the integrated circuit which is employed for signal amplification and processing, increases system complexity and adds to fabrication costs.

2. Discussion of the Prior Art

Typically, MEMS resonator filter devices are fabricated through the intermediary of standard integrated circuit masking/depositions/etching processes. For instance, specific details regarding the manufacture and structure of MEMS band-pass filters are readily disclosed in the following publications:

1) "Micromachined Devices for Wireless Communications", C. T.-C. Nguyen, L. P. B. Katechi and G. M. Rebeiz, Proc. IEEE, 86, 1756–1768.
2) "Surface Micromachining for Microelectromechanical Systems", J. M. Bustillo, R. T. Howe and R. S. Muller, Proc. IEEE, 86,1552–1574 (1998).
3) "High-Q Micromechanical Oscillators and Filters for Communications". C. T.-C. Nguyen, IEEE Intl. Symp. Circ. Sys., 2825–2828 (1997).
4) A.-C. Wong, H. Ding, C. T.-C Nguyen, "Micromechanical Mixer+Filter", Tech. Dig. of I.E.E.E./I.E.D.M., San Francisco, Calif., Dec. 198, pp 471–474.

Reverting to the foregoing publications, references (1 through 3) are primarily directed to the general field of utilizing various MEMS devices which are adapted to replacing communication elements. These publications are directed to the description of various conductors, filters and the like which have been constructed using micro-lithography and integrated circuit processing, and essentially are only of limited significance as representing technological background material with respect to the inventive concept.

A solution which is directed to solving the problem of carrier signal mixing and filtering employing micro electro-mechanical system (MEMS) devices concerning the aspects carrier signal mixing and filtering is disclosed in reference 4). This device consisted of two parallel clamped-clamped beam resonators (cantilevers), which have been coupled together with an insulating mechanical bridge. Both resonants are fabricated to possess a natural frequency IF. The input signal (RF) is capacitively coupled to one resonator, which in turn is electrically connected to a sinusoidal local oscillator (LO). The natural vibrational frequency of that resonator is RF-LO. Because of non-linear aspects of the resonator, the resonator mixes the incoming RF signal with the LO signal, and converts it into mechanical motion. This motion is mechanically coupled using the bridge, to the second resonator, which in turn is electrically connected to a DC bias. The mechanical motion induced in this resonator is then capacitively detected as the output signal. The fabricated device operates at a resonant frequency of 27 MHz. Because of the need for an insulating coupling beam between the two conducting resonators, the device is constituted of polysilicon, and then the beams doped using ion implantation. This increased the resistance of the beams considerably over that of metallic components, and consequently the increased insertion losses of the component when used in a circuit. Further, the device is about 20 $\mu$m×20 $\mu$m in size, rendering it difficult to encapsulate for protection against further IC processing.

In addition to the foregoing publications, prior patented devices which relate to electronic mixer-filters are set forth hereinbelow but which fail to provide a system and method utilizing the inventive MEMS device for communication signal mixing and filtering, in a manner analogous to that contemplated by the present invention.

For instance, Fraise U.S. Pat. No. 4,516,271, "Microwave Mixer with Recovery of the Sum Frequency", concerns the use of a wave-guide cavity to mix and filter RF signals. The function of this device is similar to that of the present concept; however, it uses reflection of electro-magnetic waves to process the signal in contrast to the mechanical resonator used here.

Sakamoto U.S. Pat. No. 5,083,139, "Pulse Radar and Components Therefor", also mixes and filter RF signals using the interference of electro-magnetic waves.

Scheinberg U.S. Pat. No. 5,563,545, "Low Cost Monolithic GaAs Upconverter Chip", uses a standard "tank-circuit" consisting of inductors, capacitors and a variable resistor to achieve mixing and filtering of an RF signal.

Kennan U.S. Pat. No. 5,649,312 "MMIC Downconverter for a Direct Broadcast Satellite Low Noise Block Downconverter", also uses standard electronic circuit components for mixing and filtering.

Abe et al., U.S. Pat. No. 5,918,168, "Double Super Tuner", uses a dielectric layer for filteration, and references nine other U.S. patents which use similar techniques.

Finally, Berenz et al., U.S. Pat. No. 5,528,769, "High Electron Mobility Transistor Monolithic Integrated Circuit Receiver", uses a "rat-ring" circuit to generate the mixing of the input RF signal to its local oscillator, This technique is also a method using standard circuit components to accomplish the RF mixer-filter step.

None of the foregoing patents suggest using mechanical vibration for this process, and are therefore not applicable to the inventive concept.

SUMMARY OF THE INVENTION

Accordingly, in order to obviate the limitations and drawbacks encountered in the constructions and fabrications of various prior art MEMS system devices, the present invention combines the step of communication carrier signal mixing and filtering into a single and simply fabricated micro electro-mechanical system (MEMS) device. The MEMS system device enables both up-frequencies and down-frequencies conversions, and through the intermediary of a single unit, compatible with the incorporation thereof into an integrated circuit chip, encompasses many electronic components which are currently separately employed to perform the same functions, while concurrently being able to be significantly reduced in size, complexity and being extremely simple to manufacture, so as to render the MEMS device pursuant to the invention economical in nature, while highly reliable in the functioning thereof.

Accordingly, it is an object of the present invention to provide a novel micro electro-mechanical system (MEMS) device which combines the steps of communication carrier signal mixing and filtering.

Another object of the present invention resides in the provision of a single, unitarily constructed micro electro-mechanical system (MEMS) device combining the steps of communication carrier signal mixing and filtering which enables both up-frequency and down-frequency conversion.

A further object of the present invention is to provide a single micro electro-mechanical system (MEMS) device which is adapted to be incorporated into an integrated circuit chip, and which encompasses a multiplicity of electronic components within the device heretofore being separately provided.

Yet another, object of the present invention resides in the provision of a method for fabrication of the herein-described micro electro-mechanical system (MEMS) device adapted for the combining of communication carrier signal mixing and filtering.

DESCRIPTION OF THE ACCOMPANYING DRAWINGS

Reference may now be had to the following detailed description of exemplary embodiments of a micro electro-mechanical system (MEMS) device pursuant to the invention, represented generally diagrammatically in the accompanying drawings; in which.

DETAILED DESCRIPTION OF PREFERRED EMBODIMENTS

Figure 1:
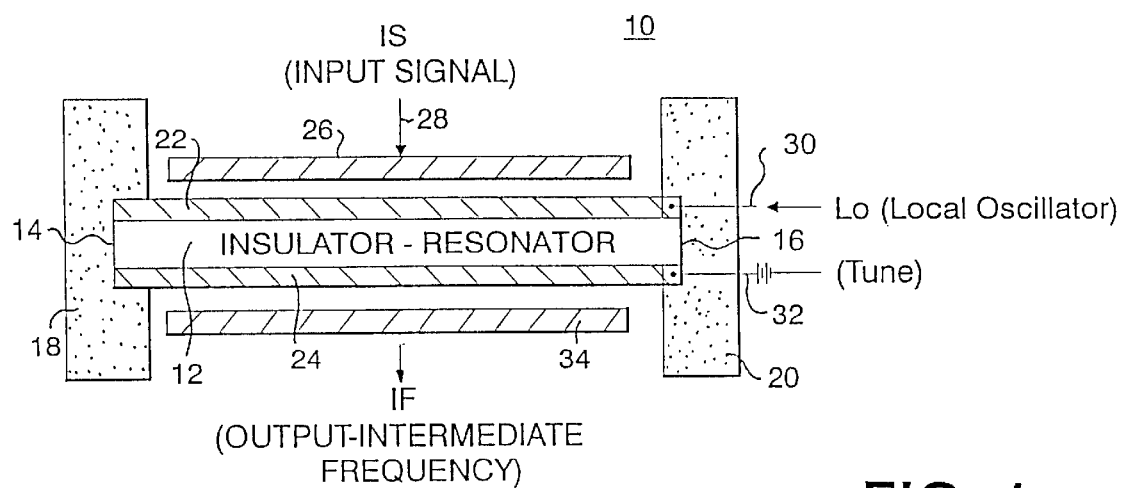
FIG. 1 illustrates a first embodiment of an MEMS device pursuant to the invention for carrier signal mixing and filtering.

As illustrated in FIG. 1 of the drawings in a generally diagrammatic representation, there is shown a side view of a micro electro-mechanical systems (MEMS) device 10 adapted for carrier signal mixing and filtering. The MEMS 10 device consists of a central bar 12 which is clamped at both ends 14,16 thereof, as represented by diagrammatically shown blocks 18 and 20. The central bar 12 is essentially constituted of an insulating core, coated on opposite sides by electrically conductive layers 22 and 24. As illustrated in this embodiment, arranged above the central bar is a stationary plate 26, constituted of an electrically conductive material, and which is connected to a source 28 of an incoming signal IS. The upper electrically conductive coating layer 22 on the central bar 12 is connected to a source 30 of a local oscillator signal LO. The central bar 12 responds to the combined forces which is generally from the electrical interaction of the input signal IS and an oscillator LO, signal so as to resultingly vibrate. Inasmuch as the central bar 12 is clamped at both ends thereof by means of the clamping components or blocks 18,20, it responds non-linearly, and resonant forces are generated at frequencies (IS+LO) and (IS−LO), assuming that the IS signal is at a higher frequency than the LO signal. The central bar 12 is constructed so as to resonate at one of these resultant frequencies; for example, at (IS−LO). At the bottom of the central bar, 12 the lower conductive layer 24 is biased by connection thereof to an electrical power source 32. Facing this conductor is a stationary pick-up plate 34, on which a charge is induced by the changing capacitance caused by the vibrations of the central bar 12. Inasmuch as the bar has a narrow natural frequency of vibration, this mechanical property acts as a filter in order to isolate only those mixed signals which are near its mechanical natural frequency. The output signal, identified by reference IF in the drawing; in essence, the intermediate frequency, is the result of mixing the incoming signal IS with the oscillating signal LO, then filtering it with the mechanical property of the vibrating central bar 12.

Figure 2:
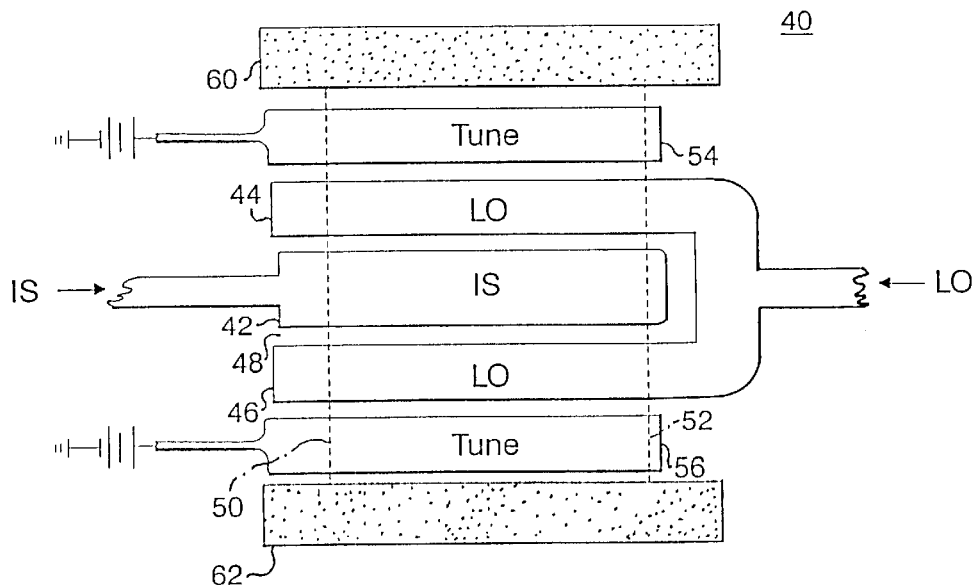
FIGS. 2 and 3 illustrate, respectively, top plan and side views of a second embodiment of an MEMS mixing and filtering device pursuant to the present invention.
Figure 3:
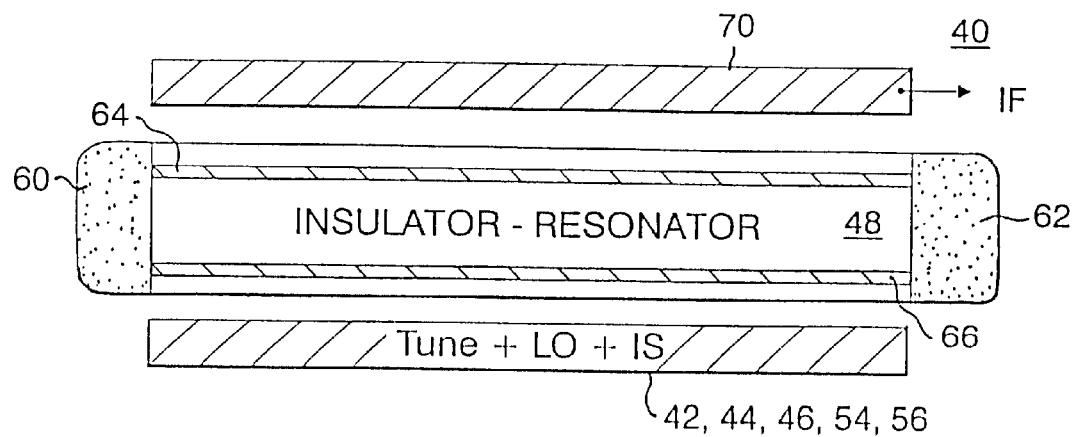

Reverting now to a further embodiment of the micro electro-mechanical systems (MEMS) device 40, as illustrated in FIGS. 2 and 3 of the drawings, as shown in the top plan view of FIG. 2, the MEMS mixer and filter device 40 provides for a central electrode which is connected to the incoming or input signal IS, and which electrode has on both sides thereof two further electrodes 44,46 which are connected to the local oscillator signal LO. These electrodes 42, and 44,46 each face the insulating vibrating bar 48 of the device 40, as illustrated by means of the dash lines 50,52 in FIG. 2. Also disclosed are two outer DC-bias electrodes 54,56 which may be utilized to tune the MEMS device 40. As shown in the side view of FIG. 3, there are shown the three levels of the device, with the side view being shown as rotated 90° relative to FIG. 2 for purposes of clarity. At the bottom are the input electrodes 42,44,46 and optional DC tuning contacts 54,56; whereas in the center is the insulating vibrating bar 48, which is clamped at both ends thereof by means of suitable clamping devices 60,62 and with the bar 48 having conductive coatings or layers 64,66 provided on both sides thereof. Both electrically conductive layers or coatings 64,66 are connected to an electrical power supply so as to be able to be biased. The incoming or input signal IS and the oscillator signal LO drive the vibrating bar 48 in a similar manner as described with regard to the embodiment of FIG. 1 of the drawings, with the natural mechanical frequency of the bar 48 selecting the desired combined mixed frequency; for example (IS–LO). The electrically conductive coating or layers 64,66 on the opposite sides of the central vibrating bar 48 produce this mixed and filtered signal (IF) on the stationary output electrode 70 which is shown at the top of FIG. 3 of the drawings.

The foregoing construction of the MEMS device 40 is essentially similar to that of the MEMS device 10 of FIG. 1, except that is somewhat more sophisticated in nature and adapted for more complex mixing-filtering applications which are not attainable with the simple MEMS device of FIG. 1.

Reverting now, in particular, to a method of fabricating an inventive mixer-filter device, in effect, a micro electromechanical systems (MEMS) device combining both mixing and filtering aspects and which is adapted to be encapsulated in a vacuum environment, reference may now be had to the sequential fabrication steps, as represented in FIGS. 4 through 10 of the drawings.

As illustrated in FIGS. 4 through 10, the construction of the MEMS device facilitates utilizing standard integrated circuit processing, with the final fabricated MEMS device being sunk below a semi-conductor chip surface and encapsulated within a vacuum ambient or environment condition. The representations as illustrated show the final resonator or MEMS device structure in cross-section with the resonator being directed perpendicularly of the plane of the drawing.

Figure 4:
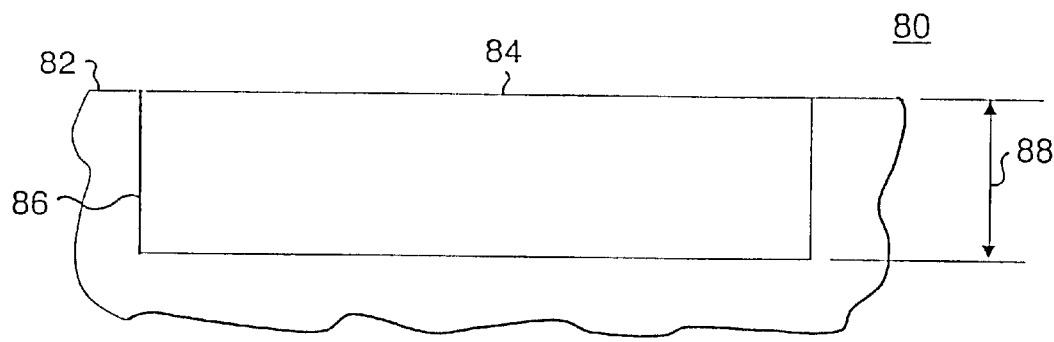
FIGS. 4 through 10, respectively, illustrate sequential steps in the fabrication of a typical MEMS device pursuant to the invention and for encapsulating a resultant mixer-filter in a vacuum environment.

Reverting in particular to FIG. 4 it is assumed that the MEMS device is being constructed on a standard silicone wafer 80.

Initially, photoresist is applied to the wafer surface 82 and an opening 84 is formed, the length of which corresponds to the desired resonator length. The width of the opening is not an essential aspect of the invention, inasmuch as it has no bearing on the mixer-filter characteristics of the MEMS device. However, typically the width of the opening may be about the same size as the length of the opening 84. After the opening 84 is formed in the photoresist, a trench 86 is etched into the silicone wafer surface 82 using reactive ion etching (RIE). The depth 88 of the trench 86 is designed to be adequate to hold all subsequent layers of the MEMS device, generally, in the magnitude of one micron in overall thickness.

Figure 5:
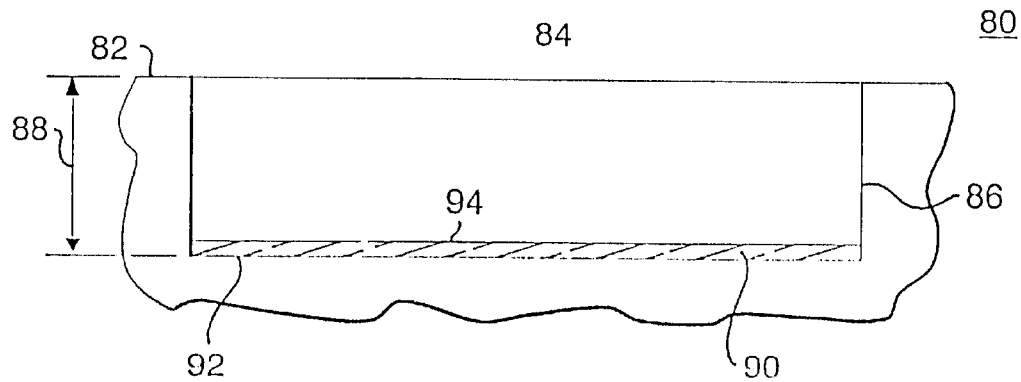

Reverting to FIG. 5 of the drawings, a thin layer of a low-temperature glass 90 is deposited on the bottom 92 of the trench 86; for example, such as a borosilicate glass which may be deposited by sputtering. The photoresist which has been deposited on the wafer surface, as described in FIG. 4 of the drawings is removed, lifting off the deposited glass from everywhere, except from the trench. The silicone wafer 80 is then heated so as to melt the glass, for example, at 300° C., so that the glass creates a smooth surface 94 covering the bottom 92 of the trench 86.

Figure 6:
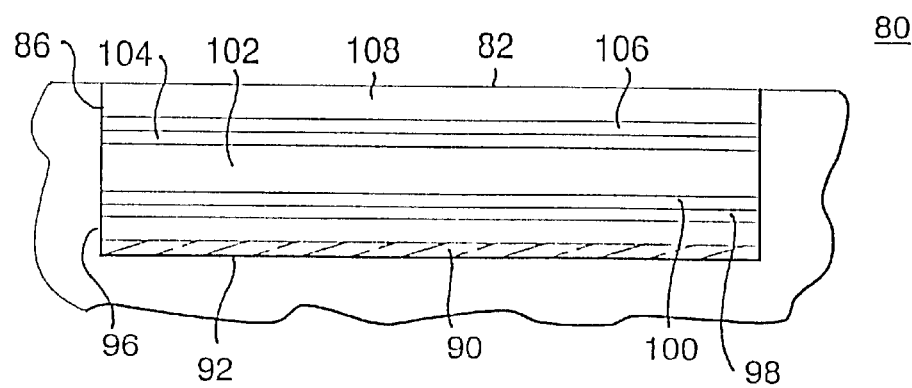

As illustrated in FIG. 6 of the drawings, there is again applied photoresist, with the same opening as employed as explained in preceding FIG. 4 of the drawings. Thereafter, successive layers of the mixer-filter MEMS device are then deposited in upward sequence on the glass layer 90. For instance, a lower layer 96 maybe constituted of tungsten, a lower release layer 98 might be diamond-like carbon (DLC), the next lower resonator conductor layer 100 may be $Si_2Co$, the resonator (vibrating plate) 102 may be $Si_3N_4$, an upper resonator conductor layer 104 may be $Si_2Co$, an upper release layer 106 may be DLC or diamond-like carbon, an upper resonator conductor 108 may be chromium with a surface monolayer of palladium. Subsequent to all of the layers having been deposited, as diagrammatically illustrated in FIG. 6 of the drawings, the photoresist is removed so as to leave these layers remaining only within the trench; in effect, below the surface 82 of the chip or wafer.

Figure 7:
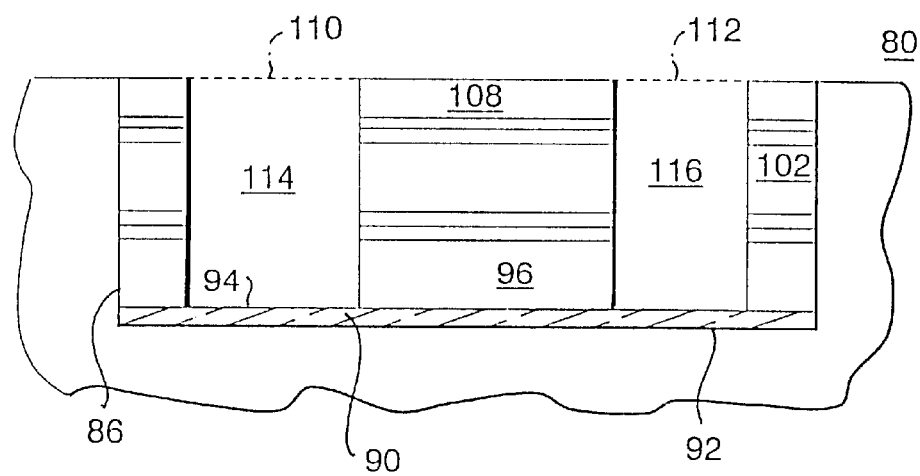

Referring to the next fabricating step, as shown in FIG. 7 of the drawings, photoresist is then applied to the upper surface 82, and two openings 110,112 made therein over the trench 86. The wafer is then subjected to RIE etching so as to produce two trenches 114,116 extending down into the layers shown in the drawing.

Although certain layers may not be suitable for RIE etching, such as the thin $Si_2Co$ layers, the RIE can be interrupted so that these may be wet-etched; for example, with buffered hydrofluoric acid. The final structure as shown in FIG. 7 creates two wells extending down to the surface 94 of the layer of glass 90 on the bottom of the trench 86.

Figure 8:
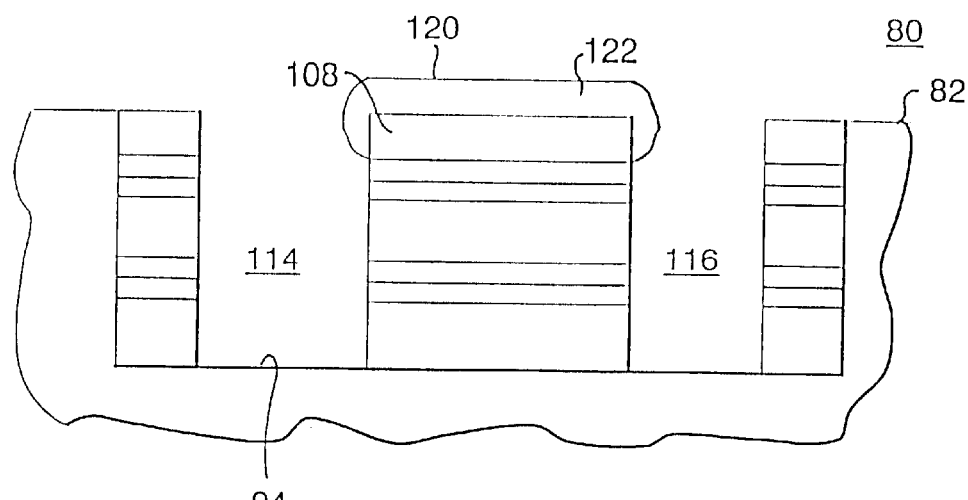

As illustrated in FIG. 8 of the drawings, the wafer 80 is now subjected to an electroless plating of copper 120. This metal is preferably deposited on a palladium seed layer 122 which is positioned on the upper conductive layer 108. This deposition will both widen and thicken the topmost layer of the device, as shown in FIG. 8.

Figure 9:
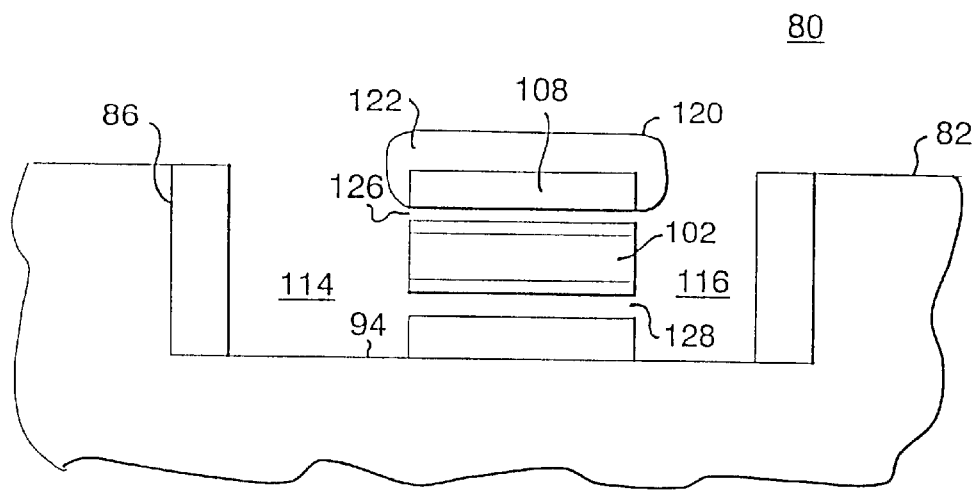

Thereafter, as shown in FIG. 9, the device is subjected to a reactive ion plasma; for example an oxygen plasma, which will react with the DLC (diamond-like carbon), converting the carbon to $CO_2$ which will sublime. This creates a gap 126,128 on both sides of the mechanical resonator structure 102.

Figure 10:
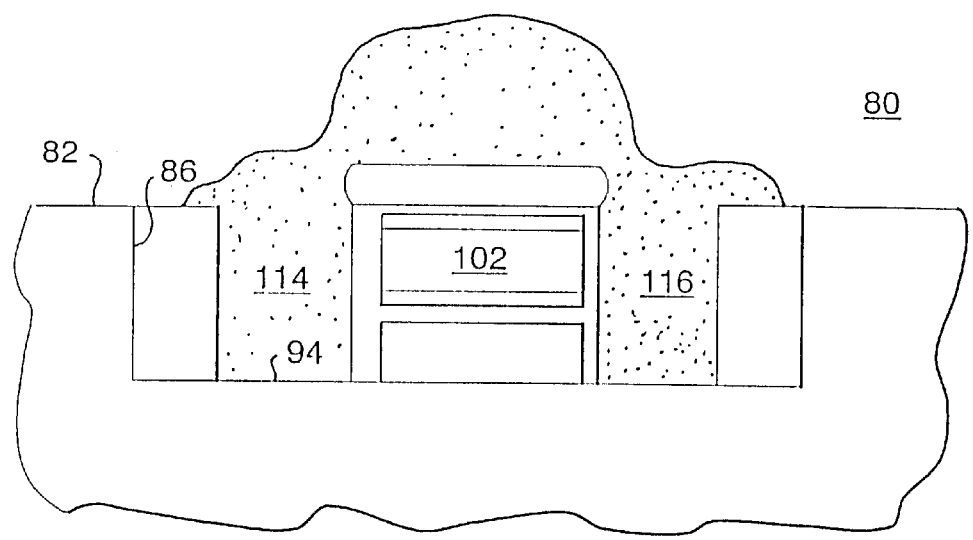

Finally, as illustrated in FIG. 10 of the drawings, an insulating material 130 is deposited thereover so as to encapsulate the device. This deposition is required to be directional; for example by evaporation from a distant source, so that the upper conductive layer 108 which was widened in the previous fabricating step illustrated in FIG. 8, will shield the resonator 102 from the deposited material. This is employed so that none of the deposited encapsulant 130 will touch the resonator 102 and prevent the mechanical or vibrating motion thereof.

The foregoing encapsulation of the mixer-filter or MEMS device in a vacuum environment facilitates the completion of the fabrication of the device. The connection of the various conducting layers to external wiring has not been shown for purposes of clarity. In essence, the MEMS device operates by applying the original incoming signal IS to the upper conductor 108, with the local oscillator signal LO being applied to the upper resonator conductor 104. The resonator dimensions (length and thickness) are determined so as to allow the beam 102 to have natural vibration at the frequency RF-LO. The lower resonator conductor 100 has a DC bias applied thereto, causing the mixed RF-LO signal, filtered by the natural mechanical resonance of the beam 102, to be induced on the lower conductor 96.

Although the foregoing elucidation illustrates preferred embodiments of the invention, the MEMS device is not limited thereto. Thus, for instance, the sequence of electrical signals may be inverted without changing the resultant conversion of the signal. This means that the incoming IS signal may be applied to layer 96, LO signal to layer 100, the DC bias to layer 104, and the output is sensed at layer 108. Similarly, the signals conveyed to layers 100 and 104 may be inverted without changing the essential nature of the operation of the micro electro-mechanical systems (MEMS) device, which facilitates the combined communication signal mixing and filtering in a single MEMS unit.

From the foregoing, it becomes readily apparent that the invention is directed to a simple unitarily-constructed, MEMS device which is highly compact in size, and of lower fabricating costs in comparison with those presently known and employed in the technology.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit of the scope of the present invention.

What is claimed is:

1. A unitarily constructed communication signal mixing and filtering device, comprising:
   a) an elongated vibratable mechanical resonance element having opposite clamped ends, said resonance element being constituted of an electrically insulative material, said resonance element having a first electrically conductive layer on one surface thereof and a second electrically conductive layer arranged on a second opposite surface thereof;
   b) means for supplying an oscillator signal (LO) to said first electrically conductive layer;
   c) means for supplying electrical power to said second electrically conductive layer;
   d) a first conductor element having an input signal (IS) supplied thereto being positioned in closely spaced relationship with said first electrically conductive layer; and
   e) a second conductor element being positioned in closely spaced relationship with said second electrically conductive layer, whereby said resonance element vibratingly responds to combined forces generated from an electrical interaction of the input signal (IS) and oscillator signal (LO) so as to generate an output signal (IF) definitive of a mixture of the input signal (IS) and oscillator signal (LO) and the natural frequency of vibration of said resonance element.

2. A device as claimed in claim 1, comprising a micro electro-mechanical (MEMS) systems device.

3. A device as claimed in claim 1, wherein said device comprises an encapsulated band-pass filter.

4. A device as claimed in claim 3, wherein said device is formed in an integrated circuit chip or wafer.

5. A device as claimed in claim 1, wherein said resonance element comprises a bar-shaped core responding non-linearly to said combined forces.

6. A device as claimed in claim 5, wherein said resonant combined forces are generated at selective frequencies of (IS+LO) and (IS−LO) when (IS) is at either a higher or lower frequency than the (LO) signal, said bar-shaped core resonating at one of said selective frequencies (IS+LO) and (IS−LO).

7. A device as claimed in claim 1, wherein said second electrically conductive layer facilitates tuning of said device for operation at predetermined frequencies.

8. A device as claimed in claim 1, wherein said device is embedded in an integrated circuit chip or wafer.

9. A device as claimed in claim 8, wherein said embedded device is an encapsulated micro electro-mechanical (MEMS) system band-pass filter which is recessed below an upper surface of said chip or wafer.

10. A device as claimed in claim 8, wherein said device has a thickness of about 1 micron.

11. A device as claimed in claim 1, wherein said resonance element is constituted of $Si_3N_4$, and said first and second electrically conductive layer arranged on the opposite surfaces of said resonance element are each constituted of $Si_2Co$.

12. A device as claimed in claim 1, wherein said first conductor element is constituted of chromium with a surface monolayer of palladium.

13. A device as claimed in claim 12, wherein said second conductor element is constituted of tungsten.

14. A unitarily constructed communication signal mixing and filtering device, comprising:
   a) an elongated vibratable mechanical resonance element having opposite clamped ends, said resonance element being constituted of an electrically insulative material, said resonance element having a first electrically conductive layer on one surface thereof, and a second electrically conductive layer on a second opposite surface thereof, said conductive layer being connected to power supplies so as to be biased thereby;
   b) a first electrode in closely spaced relationship with said resonance element having an input signal (IS) supplied thereto;
   c) second and third electrodes being positioned in closely spaced relationship with said second electrically conductive layer, said second and third electrodes being located, respectively, on opposite sides of said first electrode and having an oscillator signal (LO) commonly applied to said second and third electrodes;
   d) and an output electrode being located proximate said resonance element, whereby said resonance member vibratingly responds to combined forces generated from an electrical interaction of the input signal (IS) and oscillator signal (LO) so as to generate an output signal (IF) definitive of a mixed end filtered frequency derived from a mixture (IF−LO; IF+LO) of the input signal (IS) and oscillator signal (LO) and with the natural frequency of vibration of said resonance element selecting said mixed frequency so as to induce said mixed and filtered signal (IF) onto said output electrode.

15. A device as claimed in claim 14, comprising a micro electro-mechanical (MEMS) systems device.

16. A device as claimed in claim 14, wherein said device comprises an encapsulated band-pass filter.

17. A device as claimed in claim 16, wherein said device is formed in an integrated circuit chip or wafer.

18. A device as claimed in claim 14, wherein said device is embedded in an integrated circuit chip.

19. A device as claimed in claim 14, wherein further electrodes are arranged proximate said second and third electrodes, said further electrodes being connected to a source of DC-current so as to provide DC-biased contacts for selectively tuning the device.

20. A device as claimed in claim 14, wherein said device is embedded in an integrated circuit chip or wafer.

21. A device as claimed in claim 20, wherein said embedded device is an encapsulated micro electro-mechanical (MEMS) system band-pass filter which is recessed below an upper surface of said chip or wafer.

22. A device as claimed in claim 20, wherein said device has a thickness of about 1 micron.

23. A device as claimed in claim 14, wherein said resonance element is constituted of $Si_3N_4$, and said first and second electrically conductive layers arranged on the surfaces of said resonance element are each constituted of $Si_2Co$.

24. A device as claimed in claim 14, wherein said first conductor element is constituted of chromium with a surface monolayer of palladium.

25. A device as claimed in claim 24, wherein said second conductor element is constituted of tungsten.

26. A device as claimed in claim 14, wherein said resonance element comprises a bar-shaped core responding non-linearly to said combined forces.

27. A device as claimed in claim 26, wherein said resonant combined forces are generated at selective frequencies of (IS+LO) and (IS−LO) when (IS) is either at a higher or lower frequency than the (LO) signal, said bar-shaped core resonating at one of said selective frequencies (IS+LO) and (IS−LO).

* * * * *